(12) United States Patent
Kim et al.

(10) Patent No.: US 9,520,387 B2
(45) Date of Patent: Dec. 13, 2016

(54) STACKED PACKAGE STRUCTURE AND METHOD OF FORMING A PACKAGE-ON-PACKAGE DEVICE INCLUDING AN ELECTROMAGNETIC SHIELDING LAYER

(71) Applicant: Samsung Electronics Co., Ltd., Suwon-si (KR)

(72) Inventors: Yong-Hoon Kim, Suwon-si (KR); Hee-Seok Lee, Yongin-si (KR); Seong-Ho Shin, Hwaseong-si (KR); Se-Ho You, Seoul (KR); Yun-Hee Lee, Hwaseong-si (KR)

(73) Assignee: SAMSUNG ELECTRONICS CO., LTD., Samsung-ro, Yeongtong-gu, Suwon-si (KR)

( * ) Notice: Subject to any disclaimer, the term of this patent is extended or adjusted under 35 U.S.C. 154(b) by 0 days.

(21) Appl. No.: 14/504,972

(22) Filed: Oct. 2, 2014

(65) Prior Publication Data
US 2015/0024545 A1 Jan. 22, 2015

Related U.S. Application Data

(62) Division of application No. 13/243,704, filed on Sep. 23, 2011, now Pat. No. 8,872,319.

(30) Foreign Application Priority Data

Dec. 2, 2010 (KR) .................. 10-2010-0122012

(51) Int. Cl.
*H01L 21/00* (2006.01)
*H01L 25/00* (2006.01)
(Continued)

(52) U.S. Cl.
CPC ........... *H01L 25/50* (2013.01); *H01L 23/3128* (2013.01); *H01L 23/5226* (2013.01);
(Continued)

(58) Field of Classification Search
CPC .................. H01L 2924/00; H01L 2224/73265; H01L 2224/48227; H01L 2224/32225; H01L 25/0657; H01L 2924/3025
(Continued)

(56) References Cited

U.S. PATENT DOCUMENTS 7,777,351 B1 * 8/2010 Berry et al. ............... 257/778
8,193,624 B1 * 6/2012 Sohn .................. H01L 21/563
257/684

(Continued)

FOREIGN PATENT DOCUMENTS

CN 101572260 A 11/2009
CN 101814484 A 8/2010
(Continued)

OTHER PUBLICATIONS

OA mailed from JPO on Dec. 8, 2015 for the corresponding JP Patent Application No. 2011-263869.
(Continued)

*Primary Examiner* — David Chen
(74) *Attorney, Agent, or Firm* — Muir Patent Law, PLLC

(57) ABSTRACT

A stacked package structure is provided. The stacked package structure includes a stacked package including a lower semiconductor package, an upper semiconductor package disposed on the lower semiconductor package and spaced a predetermined distance apart from the lower semiconductor package, an inter-package connecting portion electrically connecting the lower semiconductor package and the upper semiconductor package while supporting a space therebe-
(Continued)

tween, and an insulation layer disposed at least outside the inter-package connecting portion and filling the space between the lower semiconductor package and the upper semiconductor package, and an electromagnetic shielding layer surrounding lateral and top surfaces of the stacked package.

14 Claims, 11 Drawing Sheets

(51) Int. Cl.
    *H01L 23/31*    (2006.01)
    *H01L 23/552*   (2006.01)
    *H01L 25/10*    (2006.01)
    *H01L 25/16*    (2006.01)
    *H01L 23/522*   (2006.01)
    *H01L 23/00*    (2006.01)

(52) U.S. Cl.
    CPC ............ *H01L 23/552* (2013.01); *H01L 24/11* (2013.01); *H01L 24/81* (2013.01); *H01L 25/105* (2013.01); *H01L 25/16* (2013.01); *H01L 24/45* (2013.01); *H01L 24/48* (2013.01); *H01L 24/73* (2013.01); *H01L 2224/16225* (2013.01); *H01L 2224/16235* (2013.01); *H01L 2224/32145* (2013.01); *H01L 2224/32225* (2013.01); *H01L 2224/45139* (2013.01); *H01L 2224/48225* (2013.01); *H01L 2224/48227* (2013.01); *H01L 2224/73253* (2013.01); *H01L 2224/73265* (2013.01); *H01L 2225/06568* (2013.01); *H01L 2225/107* (2013.01); *H01L 2225/1023* (2013.01); *H01L 2225/1052* (2013.01); *H01L 2225/1058* (2013.01); *H01L 2225/1088* (2013.01); *H01L 2924/00014* (2013.01); *H01L 2924/01012* (2013.01); *H01L 2924/07802* (2013.01); *H01L 2924/12042* (2013.01); *H01L 2924/14* (2013.01); *H01L 2924/1436* (2013.01); *H01L 2924/1438* (2013.01); *H01L 2924/15311* (2013.01); *H01L 2924/15321* (2013.01); *H01L 2924/15787* (2013.01); *H01L 2924/181* (2013.01); *H01L 2924/1815* (2013.01); *H01L 2924/18161* (2013.01); *H01L 2924/3025* (2013.01)

(58) Field of Classification Search
    USPC .................. 438/107, 108, 109, 110, 124
    See application file for complete search history.

(56) References Cited

U.S. PATENT DOCUMENTS

| | | |
|---|---|---|
| 2003/0098469 A1 | 5/2003 | Spielberger et al. |
| 2004/0058472 A1* | 3/2004 | Shim ............... H01L 21/561 438/108 |
| 2004/0145044 A1 | 7/2004 | Sugaya et al. |
| 2004/0238948 A1 | 12/2004 | Shiozawa et al. |
| 2005/0184377 A1* | 8/2005 | Takeuchi et al. .......... 257/686 |
| 2006/0220210 A1 | 10/2006 | Karnezos et al. |
| 2006/0220224 A1 | 10/2006 | Cheng |
| 2008/0017968 A1 | 1/2008 | Choi et al. |
| 2008/0157328 A1* | 7/2008 | Kawata ............. H01L 21/561 257/686 |
| 2008/0210462 A1* | 9/2008 | Kawagishi et al. ......... 174/377 |
| 2009/0017582 A1 | 1/2009 | Masumoto |
| 2009/0152738 A1 | 6/2009 | Sathe et al. |
| 2009/0309204 A1 | 12/2009 | Ha |
| 2010/0025837 A1* | 2/2010 | Shinoda ............. H01L 25/0657 257/686 |
| 2010/0072597 A1 | 3/2010 | Chow et al. |
| 2010/0155920 A1 | 6/2010 | Lee |
| 2011/0140247 A1 | 6/2011 | Pagaila et al. |
| 2011/0227209 A1 | 9/2011 | Yoon et al. |
| 2012/0061854 A1 | 3/2012 | Chow et al. |

FOREIGN PATENT DOCUMENTS

| | | |
|---|---|---|
| JP | 1990-041449 | 3/1990 |
| JP | 08-288686 | 11/1996 |
| JP | 1996-288686 | 11/1996 |
| JP | 2001-298115 | 10/2001 |
| JP | 2003-115691 | 4/2003 |
| JP | 2003-124011 | 4/2003 |
| JP | 2003-124236 | 4/2003 |
| JP | 2009-016714 | 1/2009 |
| KR | 10-2008-0023996 A | 3/2008 |
| KR | 10-2010-0002875 A | 1/2010 |
| KR | 10-2010-0075204 | 7/2010 |
| TW | 541635 | 7/2003 |
| TW | 200828531 | 7/2008 |
| TW | 200901414 | 1/2009 |

OTHER PUBLICATIONS

OA mailed from KIPO on Jul. 5, 2016 for the corresponding KR Patent Application No. 10-2010-0122012.
OA Mailed from TIPO on Jul. 13, 2016, for the corresponding TW Patent Application No. 100144086.
OA mailed from SIPO on Mar. 14, 2016 for the corresponding CN Patent Application No. 201110402818.2.

* cited by examiner ional application of U.S. patent application Ser. No. 13/243,704, filed Sep. 23, 2011, which claims priority under 35 U.S.C. 119 to Korean Patent Application No. 10-2010-0122012 filed on Dec. 2, 2010 in the Korean Intellectual Property Office, the contents of each of which in their entirety are herein incorporated by reference.

BACKGROUND

1. Field

The present disclosure relates to a stacked package structure.

2. Description of the Related Art

Semiconductor packages are increasingly developed to meet requirements including multiple functions, high capacity, compactness, and small size. To keep pace with the development, a system in package (SIP) has been proposed, in which multiple semiconductor packages are integrated into one single semiconductor package, enabling high capacity and multiple functions while remarkably reducing the size of the semiconductor package.

One technology of the SIP is to vertically stack semiconductor packages that are individually assembled and have undergone electric tests. This is referred to as a package-on-package (POP) or a stacked package.

In a stacked package, since a plurality of semiconductor packages are embedded into a single electronic device, electromagnetic interference (EMI) between the semiconductor packages may be generated, thereby degrading the overall performance of the electronic device and causing malfunctions to the electronic device.

SUMMARY

The present disclosure provides a stacked package structure, which can minimize electromagnetic interference (EMI) by efficiently suppressing electromagnetic waves generated from stacked packages.

The above and other objects of the present disclosure will be described in or be apparent from the following description of the preferred embodiments.

According to one embodiment, there is provided a stacked package including a lower semiconductor package, an upper semiconductor package disposed on the lower semiconductor package and spaced a predetermined distance apart from the lower semiconductor package, an inter-package connecting portion electrically connecting the lower semiconductor package and the upper semiconductor package while supporting a space therebetween, and an insulation layer disposed at least outside the inter-package connecting portion and filling the space between the lower semiconductor package and the upper semiconductor package, and an electromagnetic shielding layer surrounding lateral and top surfaces of the stacked package.

According to another embodiment, there is provided a stacked package structure including a lower semiconductor package including a lower package substrate, a lower semiconductor chip formed on a top surface of the lower package substrate, and a lower molding compound surrounding at least lateral surfaces of the lower semiconductor chip, an upper semiconductor package including an upper package substrate, and an upper semiconductor chip formed on a top surface of the upper package substrate, and disposed on the lower semiconductor package such that a bottom surface of the upper package substrate is spaced a predetermined distance apart from the lower molding compound, an inter-package connecting portion extending from the top surface of the lower package substrate through the lower molding compound, and connecting the top surface of the lower package substrate to a bottom surface of the upper package substrate, an insulation layer disposed at least outside the inter-package connecting portion and filling a space between the bottom surface of the upper package substrate and the lower molding compound, and an electromagnetic shielding layer surrounding lateral and top surfaces of a structure including the lower semiconductor package, the upper semiconductor package, the inter-package connecting portion and the insulation layer.

According to another embodiment, a package-on-package device is disclosed. The package-on-package device includes: a lower package including at least a first lower semiconductor chip stacked on a lower package substrate; an upper package including at least a first upper semiconductor chip stacked on an upper package substrate; a plurality of connecting conductors disposed between the upper package substrate and the lower package substrate, the plurality of connecting conductors surrounding lateral sides of the first lower semiconductor chip, and each connecting conductor of the plurality of connecting conductors extending at least from a top surface of the lower package substrate to a bottom surface of the upper package substrate to physically and electrically connect the upper package to the lower package; an insulation layer disposed to laterally surround a region in which the plurality of connecting conductors are disposed; and an electromagnetic shielding layer surrounding lateral and top surfaces of the package-on-package device.

According to a further embodiment, a package-on-package device is disclosed. The package-on-package device includes: a lower package including at least a first lower semiconductor chip stacked on a lower package substrate; an upper package including at least a first upper semiconductor chip stacked on an upper package substrate; a plurality of connecting conductors disposed between the upper package substrate and the lower package substrate, the plurality of connecting conductors horizontally surrounding the first lower semiconductor chip, and each connecting conductor of the plurality of connecting conductors extending at least from a top surface of the lower package substrate to a bottom surface of the upper package substrate to physically and electrically connect the upper package to the lower package; an insulation layer disposed to horizontally surround a region in which the plurality of connecting conductors are disposed; and an electromagnetic shielding layer covering lateral surfaces of the package-on-package device and contacting the insulation layer.

According to another embodiment, a method of forming a package-on-package device is disclosed. The method includes: forming a lower package including at least a first lower semiconductor chip stacked on a lower package substrate, and a lower molding portion surrounding lateral sides of the first lower semiconductor chip; forming a plurality of openings in the lower molding portion; forming an upper package including at least a first upper semiconductor chip stacked on an upper package substrate; forming a plurality of first conductors in the plurality of openings, respectively; stacking the upper package on the lower package, such that a plurality of connecting conductors that include the plurality of first conductors, respectively, are disposed between the upper package substrate and the lower package substrate, the plurality of connecting conductors disposed in a region surrounding lateral sides of the first lower semiconductor chip, and wherein each connecting conductor of the plurality of connecting conductors extends at least from a top surface of the lower package substrate to a bottom surface of the upper package substrate to physically and electrically connect the upper package to the lower package; forming an insulation layer to laterally surround the region in which the plurality of connecting conductors are disposed; and forming an electromagnetic shielding layer to surround lateral and top surfaces of the package-on-package device.

BRIEF DESCRIPTION OF THE DRAWINGS

The above and other features and advantages of the present disclosure will become more apparent by describing in detail various embodiments thereof with reference to the attached drawings in which.

DETAILED DESCRIPTION OF THE EMBODIMENTS

Figure 1:
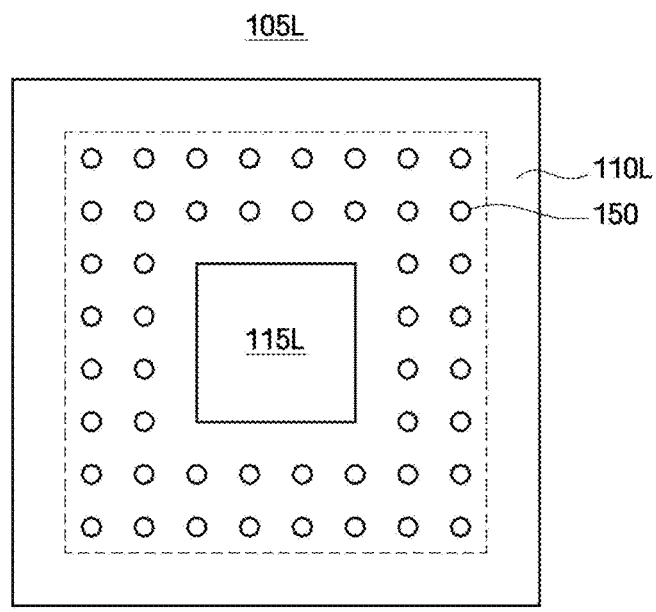
FIG. 1 is a plan view illustrating a lower package and an inter-package connecting portion included in a stacked package structure according to certain exemplary embodiments.

The present disclosure will now be described more fully hereinafter with reference to the accompanying drawings, in which various embodiments are shown. This invention may, however, be embodied in different forms and should not be construed as limited to the embodiments set forth herein. In the attached figures, the thickness of layers and regions is exaggerated for clarity.

It will also be understood that when a layer, element, or substrate is referred to as being "on," "above," "below," "connected to," or "coupled to" another layer, element, or substrate, it can be directly on, above, below, connected to, or coupled to the other layer, element or substrate, or intervening layers, elements, or substrates may also be present. In contrast, when an element is referred to as being "directly on," "directly above," "directly below," "directly connected to," or directly coupled to" another element, there are no intervening elements present. The term "contact," however, as used herein, implies a direct contact, unless indicated as otherwise.

As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures have schematic properties, and shapes of regions shown in figures exemplify specific shapes of regions of elements, and the specific properties and shapes do not limit aspects of the invention.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, these elements should not be limited by these terms. Unless indicated otherwise, these terms are only used to distinguish one element from another. For example, a first chip could be termed a second chip, and, similarly, a second chip could be termed a first chip without departing from the teachings of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Hereinafter, a stacked package structure according to a first embodiment, and modified examples thereof will be described with reference to FIGS. 1 and 2A to 2F. FIG. 1 is a plan view illustrating a lower package and an inter-package connecting portion included in a stacked package structure according to certain embodiments, and FIGS. 2A to 2F are cross-sectional views illustrating stacked package structures according to a first embodiment and modified examples thereof. The stacked package structures shown in FIGS. 2A to 2F include lower and upper packages having the same configuration except for each inter-package connecting portion. Therefore, in the following description, the stacked package structure according to the first embodiment will first be described with reference to FIGS. 1 and 2A, and the stacked package structures according to modified examples of the first embodiment, shown in FIGS. 2B to 2F, will then be described in detail with emphasis on a difference from that according to the first embodiment, that is, an inter-package connecting portion, and descriptions of the other components will not be given.

Figure 2A:
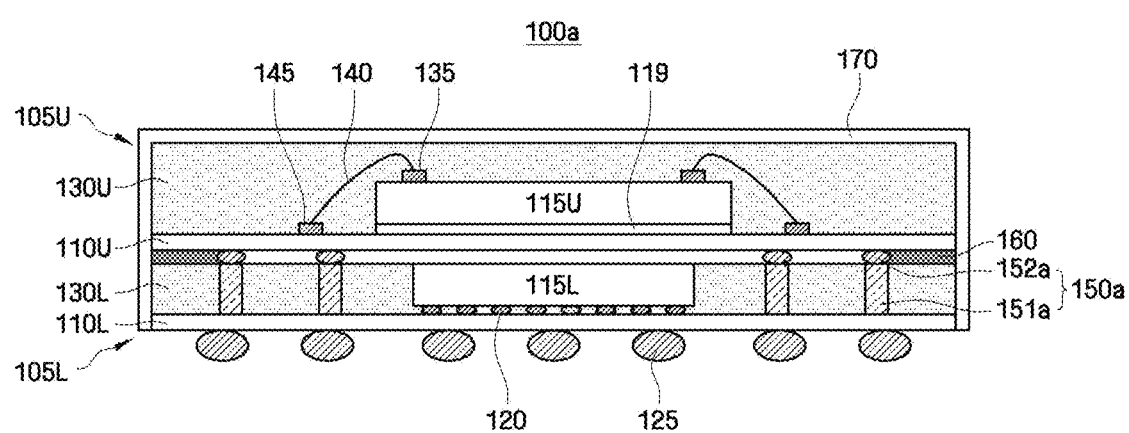
FIGS. 2A to 2F are cross-sectional views illustrating stacked package structures according to a first exemplary embodiment and modified examples thereof.

Referring to FIGS. 1 and 2A, the stacked package structure 100a according to the first embodiment includes a lower semiconductor package 105L, an upper semiconductor package 105U disposed on the lower semiconductor package 105L to be spaced a predetermined distance apart from the lower semiconductor package 105L, an inter-package connecting portion 150a electrically connecting the lower semiconductor package 105L and the upper semiconductor package 105U while supporting a space therebetween, an insulation layer 160 disposed outside the inter-package connecting portion 150a and filling the space between lower semiconductor package 105L and the upper semiconductor package 105U, and a shielding layer 170 surrounding lateral and top surfaces of a structure including the aforementioned components, that is, the lower semiconductor package 105L, the upper semiconductor package 105U, the inter-package connecting portion 150a and the insulation layer 160. In the following description, for the sake of convenient explanation, the structure including the lower semiconductor package 105L, the upper semiconductor package 105U, the inter-package connecting portion 150a and the insulation layer 160, excluding the shielding layer 170, will be referred to as a stacked package, and a structure including the stacked package and the shielding layer 170 will be referred to as a stacked package structure, or a package-on-package device.

The lower semiconductor package 105L includes a lower package substrate 110L, a lower semiconductor chip 115L formed on a top surface of the lower package substrate 110L, a lower molding compound 130L, and conductive solder balls 125 formed on a bottom surface of the lower package substrate 110L.

The lower package substrate 110L may be a substrate for a package (i.e., a package substrate), for example, a printed circuit board, or a ceramic board.

The lower semiconductor chip 115L may be a logic device such as a microprocessor. The lower semiconductor chip 115L may be mounted on the lower package substrate 110L by flip chip bonding. Accordingly, a plurality of conductive chip bumps 120 are disposed between the lower package substrate 110L and the lower semiconductor chip 115L to electrically connect the lower package substrate 110L and the lower semiconductor chip 115L. The conductive chip bumps 120 may be formed by a soldering process. Although only one lower semiconductor chip 115L is shown, the lower semiconductor package 105L may include a plurality of semiconductor chips arranged in a stack and including first, second, etc., chips. One or more of the chips may be a logic chip, and one or more of the chips may be another type of chip, such as a memory chip. Certain chips may have combined logic and memory storage functionality.

The lower molding compound 130L may form a molding layer on a top surface of the lower package substrate 110L and may be formed to surround lateral surfaces of the lower semiconductor chip 115L while filling a space between the lower semiconductor chip 115L and the lower package substrate 110L. In addition, the lower molding compound 130L surrounds the lateral surface of a portion (151a) of an inter-package connecting portion 150a to be described later, the portion extending through the lower molding compound 130L. The lower molding compound 130L may include an epoxy molding compound (EMC) or polyimide.

In this embodiment, the lower molding compound 130L has a height that is substantially the same as or smaller than that of the lower semiconductor chip 115L, thereby exposing a top surface of the lower semiconductor chip 115L. As described above, in a case where the top surface of the lower semiconductor chip 115L is exposed to the outside of the lower molding compound 130L, the overall thickness of the lower semiconductor package 105L and the overall thickness of the stacked package structure 100a are reduced and a heat dissipating characteristic is improved. In addition, resistance to a high temperature process and bending or twist resistance may increase. Further, since a physical pressure is directly applied to one surface of the lower semiconductor chip 115L without using a molding compound, grid array technology or multi-layer molding technology may be stably employed. If the thickness of the lower molding compound 130L is reduced, the overall height of the inter-package connecting portion 150a to be described later may be reduced, thereby facilitating forming of the inter-package connecting portion 150a, but the disclosed embodiments are not limited thereto. Alternatively, the lower molding compound 130L may be formed to cover the lower semiconductor chip 115L (see FIG. 4).

The solder balls 125 may be components for electrically connecting the stacked package structure 100a to a module board or a main circuit board. Solder bumps may be used in place of the solder balls 125 as well.

The upper semiconductor package 105U may include an upper package substrate 110U, an upper semiconductor chip 115U formed on a top surface of the upper package substrate 110U, and an upper molding compound 130U.

The upper package substrate 110U may be a substrate for a package (i.e., a package substrate), for example, a printed circuit board, or a ceramic board.

The upper semiconductor chip 115U may be a DRAM or a flash memory. In one embodiment, the upper semiconductor chip 115U may be mounted on the upper package substrate 110U by wire bonding. Accordingly, the upper semiconductor chip 115U and the upper package substrate 110U may be electrically connected by wires 140. In detail, the upper semiconductor chip 115U is attached to the top surface of the upper package substrate 110U using an insulating adhesive 119. Chip pads 135 disposed on the top surface of the upper semiconductor chip 115U and wire bonding pads 145 disposed on the top surface of the upper package substrate 110U may be electrically connected by the wires 140. However, wire bonding need not be used, and the upper semiconductor chip 115U may be electrically connected to the upper package substrate 110U using other connections, such as through vias (i.e., through-substrate vias, or through-silicon vias). In addition, although only one upper semiconductor chip 115U is shown, the upper semiconductor package 105U may include a plurality of semiconductor chips arranged in a stack and including first, second, etc., chips. One or more of the chips may be a logic chip, and one or more of the chips may be another type of chip, such as a memory chip. Certain chips may have combined logic and memory storage functionality.

In one embodiment, the upper semiconductor chip 115U may have a larger horizontal width or area than the lower semiconductor chip 115L. In one embodiment, since the inter-package connecting portion 150a to be described later is disposed between the bottom surface of the upper package substrate 110U and the top surface of the lower package substrate 110L, the area occupied by the inter-package connecting portion 150a is not affected by the area of the upper semiconductor chip 115U but is affected by the area of the lower semiconductor chip 115L. Therefore, the upper semiconductor chip 115U may be horizontally larger than the lower semiconductor chip 115L, thereby improving spatial efficiency while reducing spatial limitation. However, the present embodiments do not limit the sizes of the upper package substrate 110U and the lower package substrate 110L to the examples illustrated herein. The upper semiconductor chip 115U may be larger or smaller than the lower semiconductor chip 115L in horizontal width or area.

The upper molding compound 130U may form an upper molding layer formed on the top surface of the upper package substrate 110U so as to cover and surround the upper semiconductor chip 115U. The upper molding compound 130U may include an epoxy molding compound (EMC) or polyimide.

In one embodiment, the upper semiconductor package 105U and the lower semiconductor package 105L are vertically spaced a predetermined distance apart from each other and arranged up and down. In detail, the predetermined space exists between the bottom surface of the upper package substrate 110U and the lower molding compound 130L and/or the lower semiconductor chip 115L. The predetermined space is also referred to herein as a separation region.

The inter-package connecting portion 150a includes a plurality of inter-package connecting conductors horizontally disposed around the lower semiconductor chip 115L, for example, to surround the lower semiconductor chip 115L. The inter-package connecting portion 150a may include an inner region that surrounds lateral sides of the lower semiconductor chip 115L and is surrounded on its sides by an outer peripheral region. For example, in one embodiment, the inter-package connecting conductors may be formed in an array and/or may form a series of concentric rings (e.g., rectangles) surrounding the lower semiconductor chip 115L, as shown in FIG. 1. However, other arrangements may be implemented as well.

The inter-package connecting portion 150a may electrically connect the lower semiconductor package 105L and the upper semiconductor package 105U while vertically supporting a space between the lower semiconductor package 105L and the upper semiconductor package 105U, thereby electrically and physically connecting the two packages. More specifically, the inter-package connecting portion 150a physically and electrically connects the top surface of the lower package substrate 110L and the bottom surface of the upper package substrate 110. To this end, each inter-package connecting conductor 150a extends or protrudes from the top surface of the lower package substrate 110L through the lower molding compound 130L, to connect the top surface of the lower package substrate 110L to the bottom surface of the upper package substrate 110U. The inter-package connecting conductors may connect, for example, to pads on the lower package substrate 110L and pads on the upper package substrate 110U that connect to circuitry within the substrates for sending signals to and from the mounted upper and lower chips 115U and 115L.

The inter-package connecting portion 150a may be formed as substantially part of the lower semiconductor package 105L and/or part of the upper semiconductor package 105U in whole or in part. In addition, the inter-package connecting portion 150a may include a single conductor or a stacked structure of a plurality of conductors, which may be formed by separate processes or may have different shapes, heights and widths.

In one embodiment, each of the inter-package connecting portions 150a includes a lower conductor 151a and an upper conductor 152a, the lower conductor 151a having the same height as the thickness of the lower molding compound 130L while extending through the lower molding compound 130L to then contact the top surface of the lower package substrate 110L, and the upper conductor 152a disposed on the lower conductor 151a and contacting the bottom surface of the upper package substrate 110U.

Accordingly, in this embodiment, the upper conductors 152a support a space between the lower semiconductor package 105L and the upper semiconductor package 105U. Here, the lower conductor 151a may be formed as a via, and the upper conductor 152a may be made of a solder material. In the following description, a component defined as being formed as a via may be interpreted to mean that it can be formed by a via forming process, that is, a process of forming a via hole by removing a portion of the lower molding compound 130L so as to expose the top surface of the lower package substrate 110L and filling the via hole with a conductive material. The via may also be referred to as a through via, or when filled with a conductive material, a conductive through via. In addition, a component defined as being made of a solder material and/or being a bump or ball may be interpreted to mean that it can be formed by a solder process. However, the present disclosure is not limited thereto. Alternatively, the inter-package connecting portion 150a may have a stacked structure including various kinds of conductors (see FIGS. 2B to 2E).

In one embodiment, the insulation layer 160, which prevents an electrical short between a shielding layer 170 to be described later and the inter-package connecting portion 150a, is horizontally disposed outside the inter-package connecting portion 150a so as to surround the inter-package connecting portion 150a (e.g., to surround a region in which the inter-package connecting conductors are disposed) and is vertically disposed to fill the space between the lower semiconductor package 105L and the upper semiconductor package 105U. More specifically, in one embodiment, the insulation layer 160 vertically contacts the top surface of the lower molding compound 130L and the bottom surface of the upper package substrate 110U. In addition, the insulation layer 160 may be horizontally disposed in a peripheral region, for example, outside a region outlined by a dotted line, as shown in FIG. 1. As such, an inner lateral surface, or inner edge of the insulation layer 160 may contact inter-package connecting portion 150a by contacting one or more of the outer-most inter-package connecting conductors, and an outer lateral surface, or outer edge of the insulation layer 160 may contact the shielding layer 170. Further, the insulation layer 160 may fill the entire vertical distance between the upper semiconductor package 105U and the lower semiconductor package 105L to serve as a physical barrier (e.g. as a plug) to prevent conductive material from the shielding layer 170 from contacting and causing a short circuit with the inter-package connecting portion 150a when the shielding layer 170 is deposited.

The insulation layer 160 may have adhesive property in addition to an insulating property. For example, the insulation layer 160 may include an adhesive under-fill material, a dielectric material, or an insulating tape. Alternatively, the insulation layer 160 may be formed of the same material as the lower molding compound 130L, for example, an epoxy molding compound (EMC) or polyimide.

A structure, that is, a stacked package, including the lower semiconductor package 105L, the upper semiconductor package 105U, the inter-package connecting portion 150a and the insulation layer 160, may have a hexahedral shape, in one embodiment.

In one embodiment, the shielding layer 170 is formed to surround and cover surfaces, specifically top and lateral surfaces, of the hexahedral stacked package, excluding a bottom surface thereof on which the solder balls 125 are disposed. The shielding layer 170, also referred to as an electromagnetic shielding layer 170 because it shields electromagnetic radiation, removes electromagnetic waves generated from the lower semiconductor chip 115L or the upper semiconductor chip 115U included in the stacked package structure 100a, prevents the electromagnetic waves from being emitted to the outside, or prevent external electromagnetic waves from affecting the lower semiconductor chip 115L or the upper semiconductor chip 115U, thereby minimizing EMI.

The shielding layer 170 may have conductivity. The shielding layer 170 may include, for example, a soft magnetic material, a ferrite nanotube or a metal layer. Examples of the soft magnetic material may include soft metal powder, soft alloy powder, or a ferrite material. Examples of the ferrite material may include iron oxide such as FeO, $Fe_2O_3$, $Fe_2O_4$, or $Fe_3O_4$, and at least one metal used in combination with iron oxide. Examples of the metal used in combination with iron oxide may include nickel (Ni), zinc (Zn), manganese (Mn), cobalt (Co), magnesium (Mg), aluminum (Al), barium (Ba), copper (Cu), and iron (Fe). The ferrite material has high resistivity and low magnetic saturation. In addition, since the ferrite material has low mechanical strength, it can be used in combination with a metal. The soft magnetic material may be continuously or discontinuously arranged within the shielding layer 170.

The shielding layer 170 may be formed by coating or plating (refer to a method for manufacturing a stacked package structure, which will later be described. If the shielding layer 170 is formed by coating or plating, it may have a small thickness. In this case, EMI between the stacked package structure 100a and its adjacent package structure can be minimized while preventing the stacked package structure 100a from being bulky due to the shielding layer 170.

Further, even if the shielding layer 170 is formed by coating or plating, part (see 152a) of the inter-package connecting portion 150a exposed between the lower semiconductor package 105L and the upper semiconductor package 105U is still surrounded by the insulation layer 160, thereby allowing the part 152a to be electrically disconnected from the shielding layer 170. As a result, because the insulation layer 160 surrounds the exposed inter-package connecting portion 150a, a shielding material for forming the shielding layer 170 cannot penetrate into a space between the lower semiconductor package 105L and the upper semiconductor package 105U during the coating or plating. Therefore, it is easy to electrically disconnect the inter-package connecting portion 150a and the shielding layer 170 from each other.

Figure 2B:
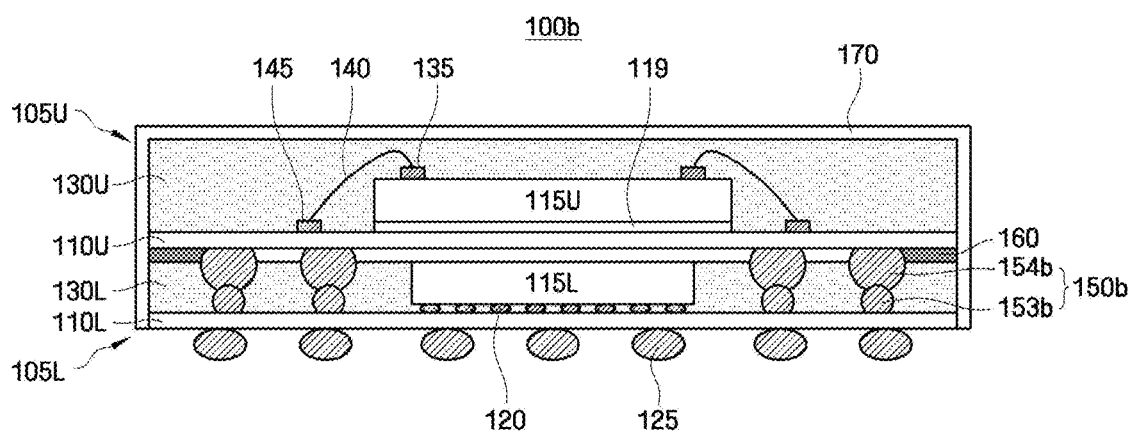

Next, referring to FIG. 2B, a stacked package structure 100b according to a first modified example of the first embodiment has substantially the same configuration as that of the stacked package structure 100a according to the first embodiment of the present invention, except for an inter-package connecting portion 150b.

The inter-package connecting portion 150b includes inter-package connecting conductors that have a stacked structure including a lower conductor 153b and an upper conductor 154b formed within a via hole exposing a top surface of the lower conductor 153b while extending through a lower molding compound 130L, and having a portion protruding on the top surface of the lower molding compound 130L. The lower conductor 153b contacts a top surface of a lower package substrate 110L and has a height smaller than a thickness of the lower molding compound 130L. The upper conductor 154b has a lower portion disposed within the via hole and a lower portion protruding on a top surface of the lower molding compound 130L.

The lower conductor 153b and the upper conductor 154b may comprise solder bumps or balls made of a solder material. Accordingly, the lower conductor 153b and the upper conductor 154b may have substantially spherical and hemispherical shapes, respectively. For example, as shown in FIG. 2B, the lower conductor 153b is substantially shaped of a hemisphere having the center point above the top surface of the lower package substrate 110L, while the upper conductor 154b is substantially shaped of a sphere, but the invention is not limited thereto. The lower conductor 153b and the upper conductor 154b may have various shapes.

In addition, a vertical height of the lower conductor 153b may be smaller than a thickness of the lower molding compound 130L and smaller than a vertical height of the upper conductor 154b. A horizontal width or area of the lower conductor 153b may be smaller than a horizontal width or area of the upper conductor 154b. In other words, the lower conductor 153b may be smaller than the upper conductor 154b in size. As can be seen from a method for manufacturing a stacked package structure, which will later be described, the lower conductor 153b may be formed as part of the lower semiconductor package 105L and the upper conductor 154b may be formed as part of the upper semiconductor package 105U. Accordingly, the size and arrangement accuracy of the inter-package connecting portion 150b can be improved by reducing the size of the lower conductor 153b and increasing the size of the upper conductor 154b.

Figure 2C:
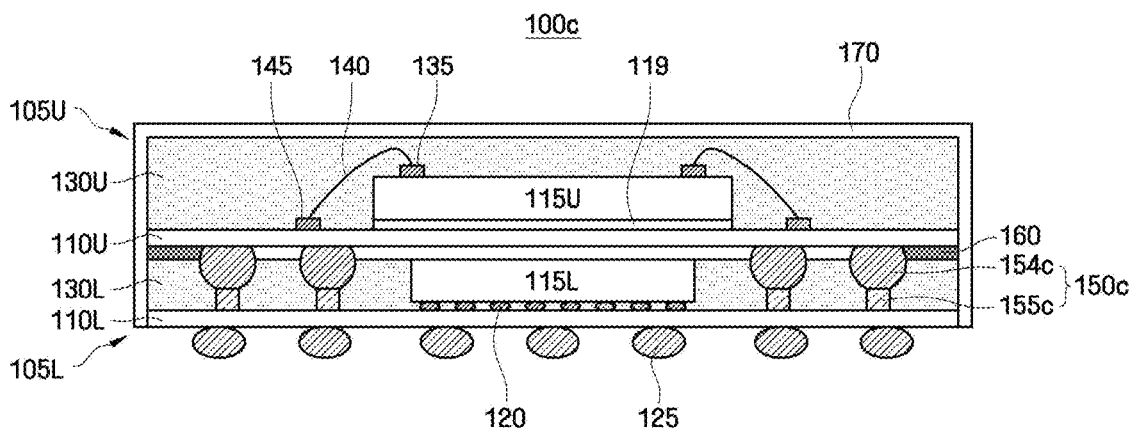

Next, referring to FIG. 2C, a stacked package structure 100c according to a second modified example of the first embodiment has substantially the same configuration as that of the stacked package structure 100a according to the first embodiment, except for an inter-package connecting portion 150c.

The inter-package connecting portion 150c includes inter-package connecting conductors having a stacked structure including a lower conductor 155c, and an upper conductor 154c formed within a via hole exposing a top surface of a lower conductor 155c while extending through a lower molding compound 130L, and having a portion protruding on a top surface of the lower molding compound 130L. The lower conductor 155c contacts a top surface of a lower package substrate 110L and has a height smaller than the thickness of the lower molding compound 130L. The upper conductor 154c has a lower portion disposed within the via hole and an upper portion protruding above a top surface of the lower molding compound 130L.

The lower conductor 155c may be a conductor shaped of a pillar, such as a cylinder or a polyprism, formed by a variety of methods including casting, deposition, adhesion, plating, and so on. The upper conductor 154c may be made of a solder material, like the upper conductor 154b shown in FIG. 2B, and may have a substantially spherical and hemispherical shape.

In addition, a vertical height of the lower conductor 155c may be smaller than a thickness of the lower molding compound 130L and smaller than a vertical height of the upper conductor 154c. A horizontal width or area of the lower conductor 155c may be smaller than a horizontal width or area of the upper conductor 154c. In other words, the lower conductor 155c may be smaller than the upper conductor 154c in size. As can be seen from a method for manufacturing a stacked package structure, which will later be described, the lower conductor 155c may be formed as part of a lower semiconductor package 105L and the upper conductor 154c may be formed as part of an upper semiconductor package 105U.

Figure 2D:
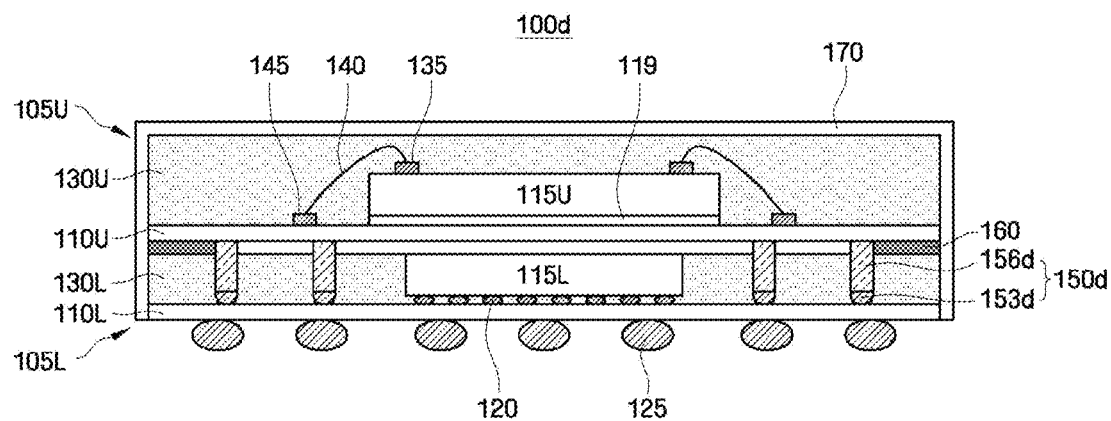

Next, referring to FIG. 2D, a stacked package structure 100d according to a third modified example of the first embodiment has substantially the same configuration as that of the stacked package structure 100a according to the first embodiment, except for an inter-package connecting portion 150d.

The inter-package connecting portion 150d includes inter-package connecting conductors having a stacked structure including a lower conductor 153d, and an upper conductor 156d formed within a via hole exposing a top surface of the lower conductor 153d while extending through the lower molding compound 130L, and having a portion protruding on a top surface of a lower molding compound 130L. The lower conductor 153d contacts a top surface of the lower package substrate 110L and has a height smaller than a thickness of the lower molding compound 130L. The upper conductor 156d has a lower portion disposed within the via hole and a lower portion protruding above a top surface of the lower molding compound 130L.

The lower conductor 153d may be substantially the same as the lower conductor 153b shown in FIG. 2B. For example, the lower conductor 153d may be part of a lower semiconductor package 105L and may be made of a solder material, so that it may have a substantially spherical or hemispherical shape. The upper conductor 156d may be part of an upper semiconductor package 105U. More specifically, the upper conductor 156d may be attached to a bottom surface of the upper package substrate 110U by a separate process. The upper conductor 156d may be made of a metal in a stud, stick or pillar shape. Alternatively, the upper conductor 156d may be part of the lower semiconductor package 150L, and may fill in a hole in lower molding compound 130L.

Figure 2E:
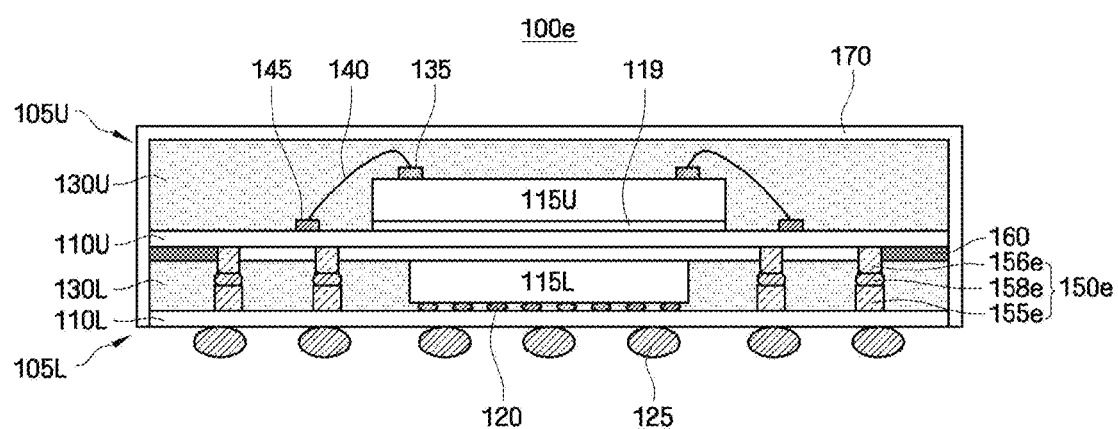

Next, referring to FIG. 2E, a stacked package structure 100e according to a fourth modified example of the first embodiment has substantially the same configuration as that of the stacked package structure 100a according to the first embodiment, except for an inter-package connecting portion 150e.

The inter-package connecting portion 150e includes inter-package connecting conductors having a stacked structure including a lower conductor 155e, an upper conductor 156e formed within a via hole exposing a top surface of the lower conductor 155e while extending through a lower molding compound 130L, and having a portion protruding on the top surface of the lower molding compound 130L, and an intermediate conductor 158e interposed between the lower conductor 155e and the upper conductor 156e. The lower conductor 155e contacts the top surface of the lower package substrate 110L and has a height smaller than a thickness of the lower molding compound 130L. The upper conductor 156e has a lower portion disposed within the via hole and a lower portion protruding on the top surface of the lower molding compound 130L. The intermediate conductor 158e is interposed between the lower conductor 155e and the upper conductor 156e.

The lower conductor 155e may be substantially the same as the lower conductor 155c shown in FIG. 2C or the upper conductor 156d shown in FIG. 2D. For example, the lower conductor 155e may be part of a lower semiconductor package 105L and may be substantially shaped of a pillar. The upper conductor 156e may be, for example, package bumps as part of an upper semiconductor package 105U. The intermediate conductor 158e may be interposed between the lower conductor 155e and the upper conductor 156e to connect the lower conductor 155e and the upper conductor 156e to each other, and may be made, for example, of a conductive adhesive material.

Figure 2F:
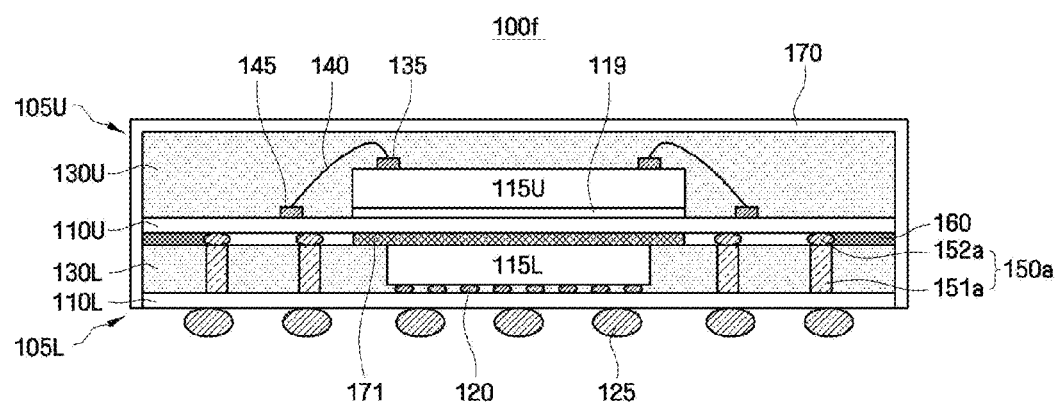

Next, referring to FIG. 2F, a stacked package structure 100f according to a fifth modified example of the first embodiment has substantially the same configuration as that of the stacked package structure 100a according to the first embodiment, except for a shielding layer 171. The shielding layer 171 may be formed on a lower semiconductor chip 115L. More specifically, the shielding layer 171 may be formed adjacent to a portion of the lower semiconductor chip 115L and a portion of the lower molding compound 130L (for example, on top surfaces of the lower semiconductor chip 115L and lower molding compound 130L), and may be formed in a tape type. The shielding layer 171 removes or shields electromagnetic waves between the lower semiconductor chip 115L and the upper semiconductor chip 116U. As such, EMI between the lower semiconductor chip 115L and the upper semiconductor chip 116U can be minimized.

The above-described inter-package connecting portions 150a-150e according to the first embodiment and the modified examples thereof include stacked structures of two or more conductors. In one embodiment, the stacked conductors included in the inter-package connecting portion 150 are formed by separate processes, respectively, and may be formed as part of the lower semiconductor package 105L or the upper semiconductor package 105U. The respective conductors may have different shapes, heights or widths.

In the above-described first embodiment and the modified examples thereof, the lower semiconductor package 105L including the lower semiconductor chip 115L mounted by flip chip bonding, and the upper semiconductor package 105U including the upper semiconductor chip 115U mounted by wire bonding have been described, but the present invention is not limited thereto. Alternatively, both of the lower semiconductor chip 115L of the lower semiconductor package 105L and the upper semiconductor chip 115U of the upper semiconductor package 105U may be mounted by flip chip bonding, or wire bonding. Conversely, unlike in the first embodiment and the modified examples thereof, the lower semiconductor chip 115L of the lower semiconductor package 105L and the upper semiconductor chip 115U of the upper semiconductor package 105U may be mounted by wire bonding and flip chip bonding, respectively. Also, as described above, the chips may be electrically connected to the respective package substrates using conductive through-via electrodes, and one or more chips may be included in each semiconductor package.

Figure 3:
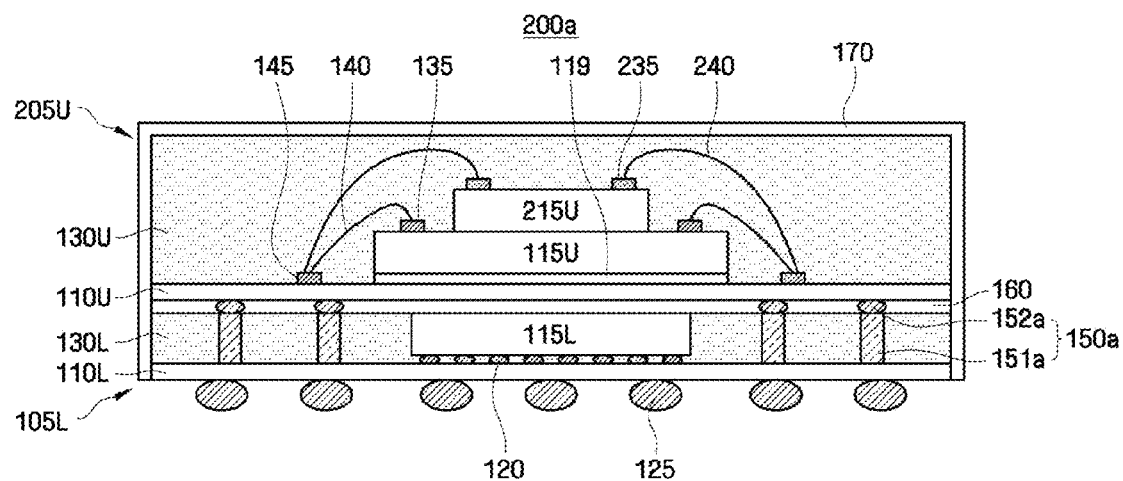
FIG. 3 is a cross-sectional view illustrating a stacked package structure according to a second exemplary embodiment.

Hereinafter, a stacked package structure according to a second embodiment of the present invention will be described with reference to FIG. 3. FIG. 3 is a cross-sectional view illustrating a stacked package structure according to a second embodiment of the present invention. Here, the stacked package structure shown in FIG. 3 has substantially the same configuration as that of the stacked package structure 100a according to the first embodiment of the present invention, except that two vertically stacked upper semiconductor chips are included in the upper semiconductor package. Therefore, in the following description, the stacked package structure will be described in detail with emphasis on a difference from that according to the first embodiment, and descriptions of the other components will not be given.

Referring to FIG. 3, the stacked package structure 200a according to the second embodiment includes a stacked package and a shielding layer 170 surrounding lateral and top surfaces of the stacked package, the stacked package including a lower semiconductor package 105L, an upper semiconductor package 205U disposed on the lower semiconductor package 105L to be spaced a predetermined distance apart from the lower semiconductor package 105L, an inter-package connecting portion 150a electrically connecting the lower semiconductor package 105L and the upper semiconductor package 205U while supporting a space therebetween, and an insulation layer 160 disposed in a peripheral region of the inter-package connecting portion 150a and filling the space between the lower semiconductor package 105L and the upper semiconductor package 205U.

The upper semiconductor package 205U includes an upper package substrate 110U, a first upper semiconductor chip 115U disposed on a top surface of the upper package substrate 110U, a second upper semiconductor chip 215U disposed on a top surface of the first upper semiconductor chip 115U, and an upper molding compound 130U. Here, the first upper semiconductor chip 115U has substantially the same configuration as that of the upper semiconductor chip 115U according to the first embodiment but is denoted by the first upper semiconductor chip 115U to be distinguished from the second upper semiconductor chip 215U.

The second upper semiconductor chip 215U is disposed on the first upper semiconductor chip 115U and may be electrically connected to the upper package substrate 110U by wires 240. Specifically, the second upper semiconductor chip 215U may be attached to a top surface of the first upper semiconductor chip 115U using an insulating adhesive (not shown). A chip pad 235 disposed on a top surface of the second upper semiconductor chip 215U and a wire bonding pad 145 disposed on a top surface of the upper package substrate 110U may be electrically connected to each other by the wire 240. Alternatively, through vias (e.g., through-substrate vias or through-silicon vias) may be used to electrically connect the chips.

In this embodiment, the first upper semiconductor chip 115U is horizontally larger than the second upper semiconductor chip 215U in width or area, but the disclosure is not limited thereto. Alternatively, the first upper semiconductor chip 115U may be horizontally equal to or smaller than the second upper semiconductor chip 215U in width or area.

In addition, first upper semiconductor chip 115U and the second upper semiconductor chip 215U may be chips of the same type or different types.

As described above, in order to facilitate forming of the inter-package connecting portion 150a, the overall thickness of the lower semiconductor package 105L may be reduced, without affecting the thickness of the upper semiconductor package 105U. Therefore, as in this embodiment, the upper semiconductor package 205U may include two vertically stacked semiconductor chips, but the invention is not limited thereto. Alternatively, the upper semiconductor package 205U may include three or more vertically stacked semiconductor chips, which are of the same type or different types.

Meanwhile, the stacked package structure 200a according to the second embodiment includes the inter-package connecting portion 150a, but the disclosure is not limited thereto. Alternatively, a stacked package structure including at least one of inter-package connecting portions 150b-150e according to modified examples of the first embodiment, instead of the inter-package connecting portion 150a according to the first embodiment while including the other components having substantially the same configurations as the stacked package structure 200a, or a stacked package structure including an inter-package connecting portion that is not described herein, may also be encompassed within the scope of the disclosed embodiments.

Figure 4:
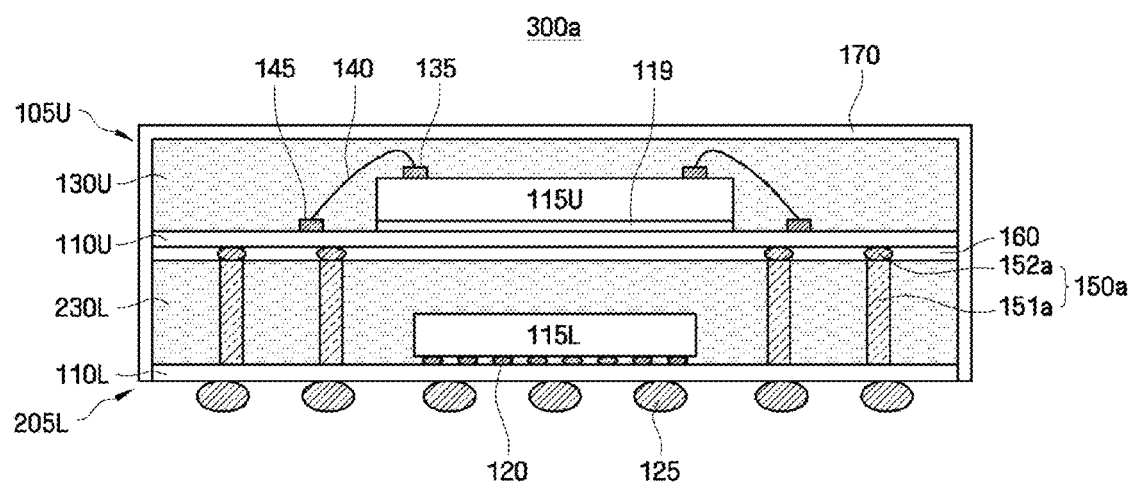
FIG. 4 is a cross-sectional view illustrating a stacked package structure according to a third exemplary embodiment.

Hereinafter, a stacked package structure according to a third embodiment will be described with reference to FIG. 4. FIG. 4 is a cross-sectional view illustrating a stacked package structure according to a third embodiment. Here, the stacked package structure shown in FIG. 4 has substantially the same configuration as that of the stacked package structure 100a according to the first embodiment of the present invention, except that a lower molding compound of a lower semiconductor package covers a lower semiconductor chip. Therefore, in the following description, the stacked package structure will be described in detail with emphasis on a difference from that according to the first embodiment, and descriptions of the other components will not be given.

Referring to FIG. 4, the stacked package structure 300a according to the third embodiment includes a stacked package and a shielding layer 170 surrounding lateral and top surfaces of the stacked package, the stacked package including a lower semiconductor package 205L, an upper semiconductor package 105U disposed on the lower semiconductor package 205L to be spaced a predetermined distance apart from the lower semiconductor package 205L, an inter-package connecting portion 150a electrically connecting the lower semiconductor package 205L and the upper semiconductor package 105U while supporting a space therebetween, and an insulation layer 160 disposed in a peripheral region of the inter-package connecting portion 150a and filling the space between the lower semiconductor package 205L and the upper semiconductor package 105U.

The lower semiconductor package 205U includes a lower package substrate 110L, a lower semiconductor chip 115L formed on a top surface of the lower package substrate 110L by flip chip bonding, a lower molding compound 230L, and conductive solder balls 125 formed on a bottom surface of the lower package substrate 110L.

Here, the lower molding compound 230L may be formed on the top surface of the lower package substrate 110L so as to cover the lower semiconductor chip 115L, that is, to surround and cover lateral and top surfaces of the lower semiconductor chip 115L, while filling a space between the lower semiconductor chip 115L and the lower package substrate 110L.

In one embodiment, the stacked package structure 300a according to the third embodiment includes the inter-package connecting portion 150a according to the second embodiment, but the disclosure is not limited thereto. Alternatively, a stacked package structure including at least one of inter-package connecting portions 150b-150e according to modified examples of the first embodiment, instead of the inter-package connecting portion 150a according to the first embodiment while including the other components having substantially the same configurations as the stacked package structure 300a, or a stacked package structure including an inter-package connecting portion that is not described herein, may also be encompassed within the scope of the present disclosure.

Figure 5:
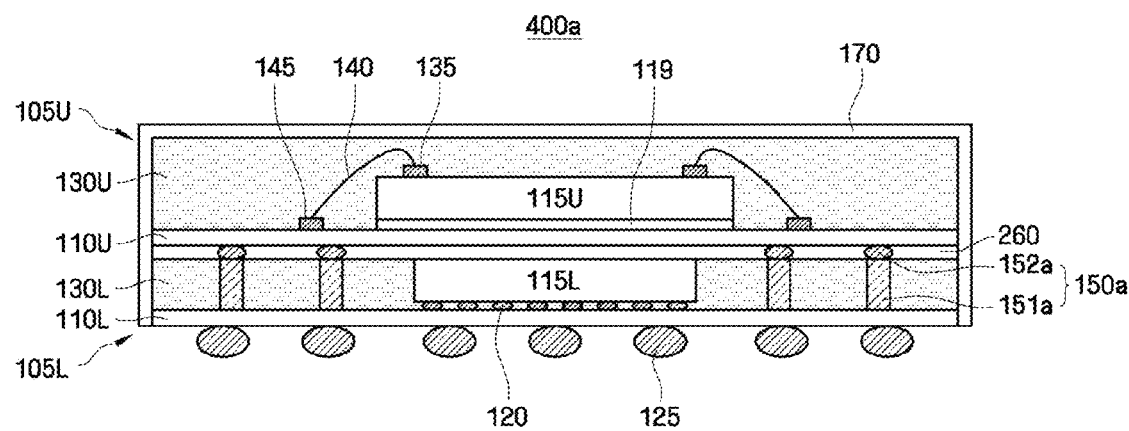
FIG. 5 is a cross-sectional view illustrating a stacked package structure according to a fourth exemplary embodiment.

Hereinafter, a stacked package structure according to a fourth embodiment will be described with reference to FIG. 5. FIG. 5 is a cross-sectional view illustrating a stacked package structure according to a fourth embodiment. Here, the stacked package structure shown in FIG. 5 has substantially the same configuration as that of the stacked package structure 100a according to the first embodiment, except for an insulation layer filling a space between a lower semiconductor package and an upper semiconductor package. Therefore, in the following description, the stacked package structure will be described in detail with emphasis on a difference from that according to the first embodiment, and descriptions of the other components will not be given.

Referring to FIG. 5, the stacked package structure 400a according to the fourth embodiment includes a stacked package and a shielding layer 170 surrounding lateral and top surfaces of the stacked package, the stacked package including a lower semiconductor package 105L, an upper semiconductor package 105U disposed on the lower semiconductor package 105L to be spaced a predetermined distance apart from the lower semiconductor package 105L, an inter-package connecting portion 150a electrically connecting the lower semiconductor package 105L and the upper semiconductor package 105U while supporting a space therebetween, and an insulation layer 260 disposed in a region where the inter-package connecting portion 150a is not formed and filling the space between the lower semiconductor package 105L and the upper semiconductor package 105U.

For example, in this embodiment, the insulation layer 260 is horizontally disposed in a peripheral region of the inter-package connecting portion 150a and may be further disposed in all the regions other than the inter-package connecting portion 150a, while vertically filling the space between the lower semiconductor package 105L and the upper semiconductor package 105U. Since the insulation layer 260 is provided for the purpose of preventing an electrical short between the shielding layer 170 and the inter-package connecting portion 150a, it may be further disposed in regions other than the inter-package connecting portion 150a as long as it is formed in the peripheral region of the inter-package connecting portion 150a so as to surround the inter-package connecting portion 150a.

The insulation layer 260 may have adhesive properties in addition to an insulating property. For example, the insulation layer 260 may include an adhesive under-fill material, a dielectric material, or an insulating tape.

The stacked package structure 400a according to this embodiment has substantially the same configuration as the stacked package structure 100a according to the first embodiment, but the disclosure is not limited thereto. Alternatively, stacked package structures each including the insulation layer 260, instead of the insulation layer 160 in each of the stacked package structures 100b-100e according to modified examples of the first embodiment, may also be encompassed within the scope of the present disclosure.

Hereinafter, a method of fabricating a stacked package structure according to a fifth embodiment will be described with reference to FIGS. 6A to 7E.

FIGS. 6A to 6I are cross-sectional views illustrating a method of fabricating a stacked package structure according to a fifth embodiment.

First, an upper semiconductor package 105U including upper conductors 152a formed on its bottom surface is provided through processes shown in FIGS. 6A and 6B, which will now be described in more detail.

Figure 6A:
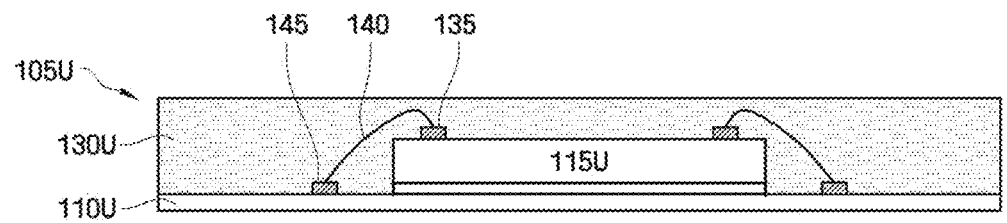
FIGS. 6A to 6I are cross-sectional views illustrating a method of fabricating a stacked package structure according to a fifth exemplary embodiment.

Referring to FIG. 6A, an upper semiconductor chip 115U is disposed on an upper package substrate 110U including a wire bonding pad 145 and other lands or pads (not shown). The upper semiconductor chip 115U may be attached to the upper package substrate 110U using an insulating adhesive (not shown). The upper semiconductor chip 115U may include a chip pad 135 and other pads (not shown) disposed on its top surface.

Next, the chip pad 135 disposed on the top surface of the upper semiconductor chip 115U and the wire bonding pad 145 disposed on the top surface of the upper package substrate 110U are electrically connected to each other using wires 140. However, instead of wires connecting chip pads to substrate pads, other elements may be used, such as through vias. In such a case, the chip pads and substrate pads may be located in different locations to allow for a connection using through vias.

Next, an upper molding compound 130U is formed on the top surface of the upper package substrate 110U to cover and surround the upper semiconductor chip 115U.

Figure 6B:
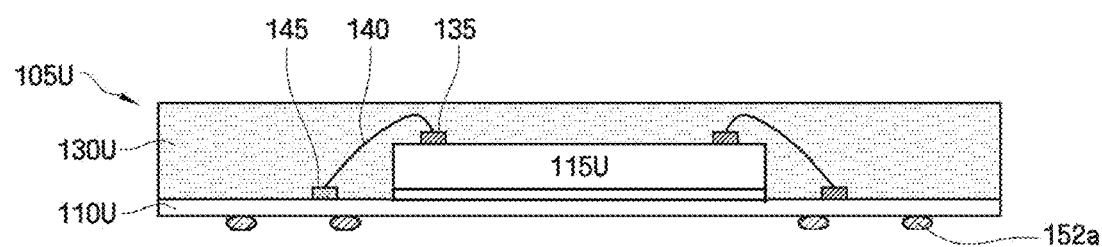

Referring to FIG. 6B, upper conductors 152a are formed on the bottom surface of the upper package substrate 110U. The upper conductors 152a may form part of the inter-package connecting portion 150a while forming part of the upper semiconductor package 105U. The upper conductors 152a may be formed by, for example, soldering, and may have shapes of bumps or small balls, for example.

In addition, a lower semiconductor package 105L including lower conductors 151a is provided through processes shown in FIGS. 6C to 6F, which will now be described in more detail.

Figure 6C:
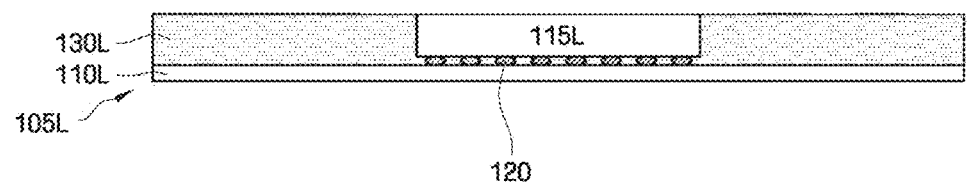

Referring to FIG. 6C, a plurality of chip bumps 120 are formed on a lower package substrate 110L including other necessary lands or pads (not shown). The chip bumps 120 may be formed by soldering, and may be electrically connected to chip bump lands (not shown) of the lower package substrate 110L.

Next, the lower semiconductor chip 115L is mounted on the chip bumps 120. The lower semiconductor chip 115L may be designed, for example, as a flip chip and in one embodiment may be a logic device.

Next, a lower molding compound 130L is formed to a thickness enough to expose the top surface of the lower semiconductor chip 115L while surrounding lateral surfaces of the lower semiconductor chip 115L. For example, the lower molding compound 130L may be formed in the following manner. In one embodiment, a molding control film (not shown) is formed so as to closely contact the top surface of the lower semiconductor chip 115L to secure a space between the molding control film and the lower package substrate 110L, followed by filling the space with the lower molding compound 130L, thereby forming the lower molding compound 130L, but the present disclosure is not limited thereto. Alternatively, the lower molding compound 130L may be formed to cover the lower semiconductor chip 115L (see FIG. 4).

Figure 6D:
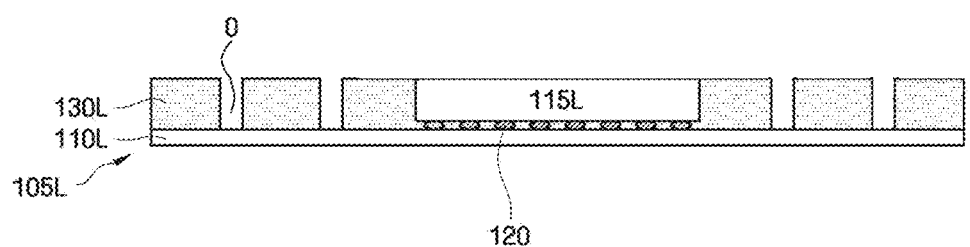

Referring to FIG. 6D, part of the lower molding compound 130L, that is, a potential region of an inter-package connecting portion 150a, is removed, thereby forming one or more openings O exposing the top surface of the lower package substrate 110L. The openings O may be via holes. The removing of the part of the lower molding compound 130L may be performed by laser drilling.

Figure 6E:
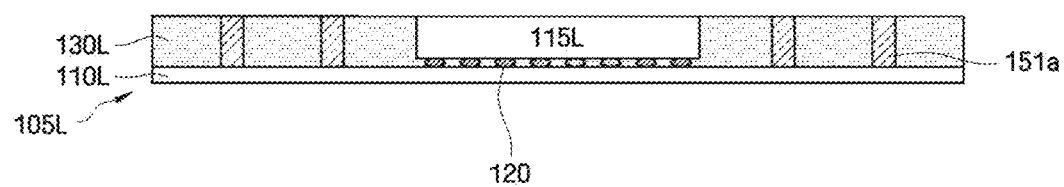

Referring to FIG. 6E, each opening O is filled with a conductive material to form a lower conductor 151a. The lower conductor 151a may be a via extending through the lower molding compound 130L. The lower conductor 151a may form part of the inter-package connecting portion 150a while forming part of the lower semiconductor package 105L.

Figure 6F:
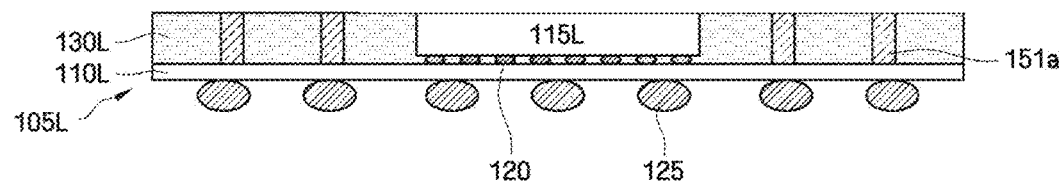

Referring to FIG. 6F, solder bumps or balls 125 are formed on the bottom surface of the lower package substrate 110L. The solder balls 125 may be electrically connected to the chip bumps 120 and may be formed, for example, by soldering.

Figure 6G:
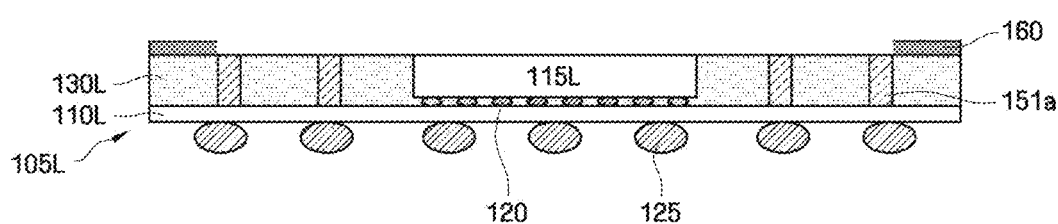

After performing the processes shown in FIGS. 6A to 6F, referring to FIG. 6G, an insulation layer 160 is formed on the top surface of the lower molding compound 130L so as to laterally surround the lower conductors 151a from the peripheral regions of the lower conductors 151a. The forming of the insulation layer 160 may be performed, for example, by coating an under-fill material or attaching an insulating tape, but the present disclosure is not limited thereto. Although not shown, the insulation layer 160 may be alternatively formed on the bottom surface of the upper package substrate 110U so as to laterally surround the upper conductors 152a from the peripheral regions of the upper conductors 152a, corresponding to the position of the insulation layer 160 shown in FIG. 6G.

Figure 6H:
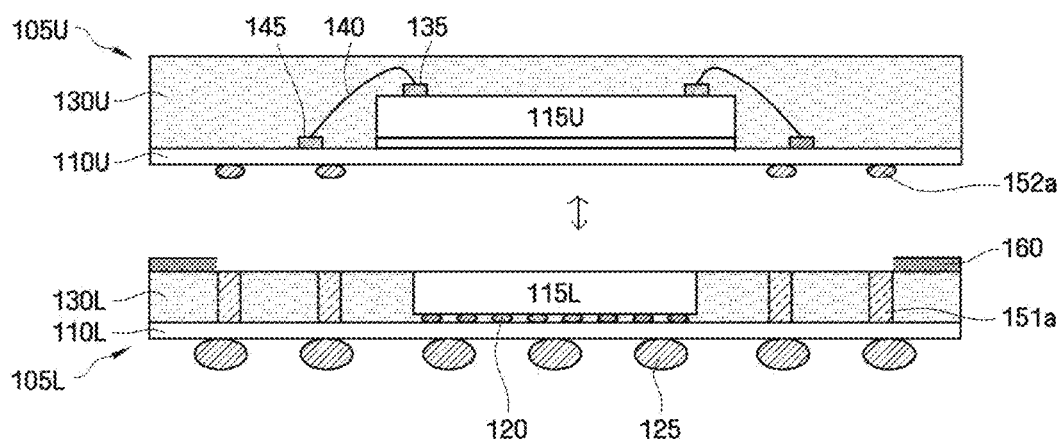

Referring to FIG. 6H, the upper semiconductor package 105U is stacked on the lower semiconductor package 105L having the insulation layer 160. More specifically, the upper semiconductor package 105U is disposed on the lower semiconductor package 105L having the insulation layer 160, followed by heating and/or compressing, thereby electrically and physically combining and connecting the lower conductor 151a and the upper conductor 152a to each other. As a result, each the lower conductor 151a and upper conductor 152a electrically and physically combined and connected to each other integrally form an inter-package connecting conductor, the plurality of which form the inter-package connecting portion (see 150a of FIG. 2A). In addition, as described above, the insulation layer 160 may have an adhesive property, so that a top surface of the lower molding compound 130L of the lower semiconductor package 105L and a bottom surface of the upper package substrate 110U of the upper semiconductor package 105U may be attached to the insulation layer 160.

Figure 6I:
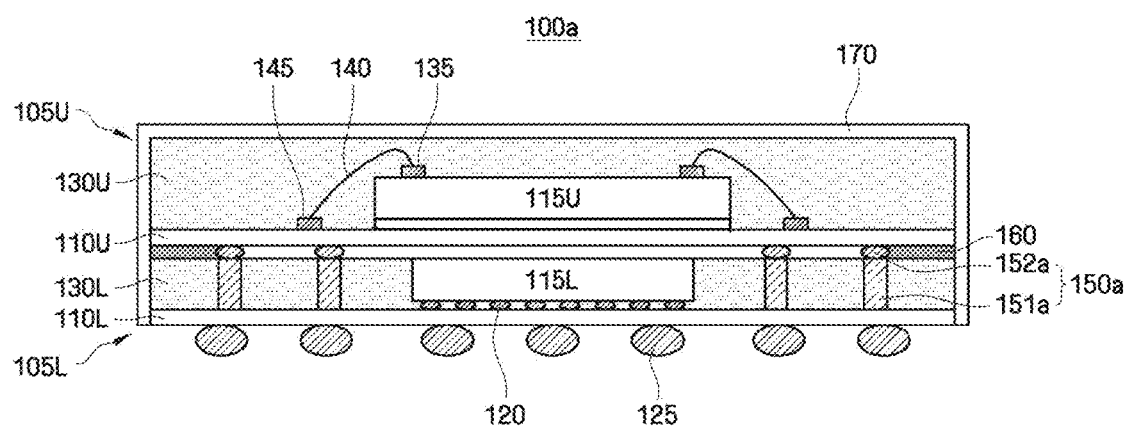

Referring to FIG. 6I, an electromagnetic shielding layer 170 is formed to surround lateral and top surfaces of a hexahedral stacked package that is a resultant product of the process shown in FIG. 6H. The forming of the electromagnetic shielding layer 170 may be performed, for example, by coating a liquid shielding material. For example, the coating may include painting or spraying. Alternatively, the forming of the shielding layer 170 may be performed by plating. Because the insulation layer 160 is formed between the inter-package connecting portion and the outside of the stacked package, material used for the shielding layer 170 is prevented from contacting the inter-package connecting portion, which prevents a short circuit from occurring.

In the above-described method for manufacturing the stacked package structure according to this embodiment, the stacked package structure 100a according to the first embodiment may be provided.

However, in one embodiment, the stacked package structure 400a according to the fourth embodiment may be provided by modifying the process shown in FIG. 6G in the method for manufacturing the stacked package structure according to the fifth embodiment. For example, after performing the processes shown in FIGS. 6A-6F, instead of the process shown in FIG. 6G, an insulation layer 260 (see FIG. 5) may be formed in a region other than a region where the lower conductors 151a are formed, on the top surface of the lower molding compound 130L. As such, processes shown in FIGS. 6H and 6I may be performed after performing the process of forming the insulation layer 260 in a region other than the upper conductors 152a on the bottom surface of the upper package substrate 110U.

Next, a method of fabricating a stacked package structure according to a sixth embodiment of the present invention will be described with reference to some of FIGS. 6A to 6I and FIGS. 7A to 7E. FIGS. 7A to 7E are cross-sectional views illustrating a method of fabricating a stacked package structure according to a sixth embodiment. In describing the current embodiment, detailed descriptions of the same and corresponding processes and figures of the fifth embodiment will not be given.

First, an upper semiconductor package 105U, as shown in FIG. 6A, is provided. Then, referring to FIG. 7A, upper conductors 154b are formed on a bottom surface of the upper package substrate 110U. The upper conductors 154b may form part of an inter-package connecting portion 150a (see FIG. 6I) while forming part of the upper semiconductor package 105U. The upper conductors 154b may be formed by, for example, soldering, and may have larger balls than those of the fifth embodiment, but the present disclosure is not limited thereto. Alternatively, upper conductors (see 156d of FIG. 2D or 156e of FIG. 2E) shaped of metal studs, sticks or pillars as package bumps may be formed on the bottom surface of the upper package substrate 110U.

In addition, a lower semiconductor package 105L including lower conductors 153b is provided through, for example, processes shown in FIGS. 7B and 7C, which will now be described in detail.

Figure 7A:
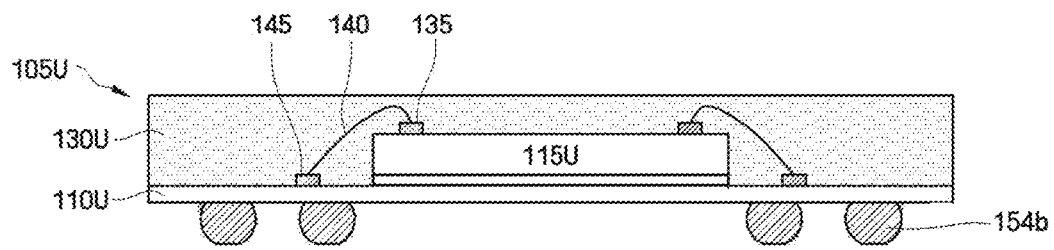
FIGS. 7A to 7E are cross-sectional views illustrating a method of fabricating a stacked package structure according to a sixth exemplary embodiment.
Figure 7B:
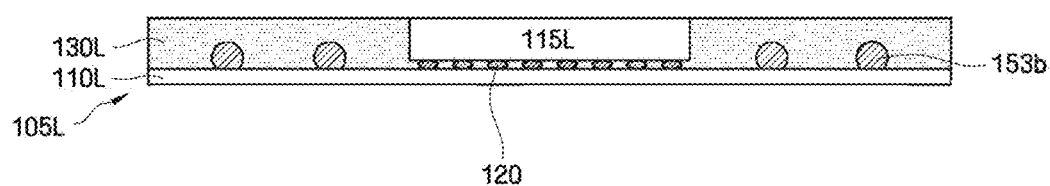

Referring to FIG. 7B, a plurality of conductive chip bumps 120 and the lower conductors 153b are formed on the lower package substrate 110L including necessary lands or pads (not shown). The chip bumps 120 may be formed, for example, by a soldering process and may be electrically connected to chip bump lands (not shown) of the lower package substrate 110L. The lower conductors 153b may be formed, for example, by soldering and may be shaped of spherical or hemispherical balls, but the present disclosure is not limited thereto. The lower conductors 153b may be formed by various methods including casting, deposition, adhesion, plating, and so on. Pillar-shaped lower conductors (see 155c of FIG. 2C or 155e of FIG. 2E) may be formed on the top surface of the lower package substrate 110L. The chip bumps 120 and the lower conductors 153b may be formed simultaneously or temporally in sequence. In addition, the chip bumps 120 and the lower conductors 153b may have the same height or different heights.

Next, the lower semiconductor chip 115L is mounted on the chip bumps 120, and a lower molding compound 130L is formed to a thickness enough to expose the top surface of the lower semiconductor chip 115L while surrounding lateral surfaces of the lower semiconductor chip 115L, but the present disclosure is not limited thereto. Alternatively, the lower molding compound 130L may be formed to cover the lower semiconductor chip 115L (see FIG. 4).

Figure 7C:
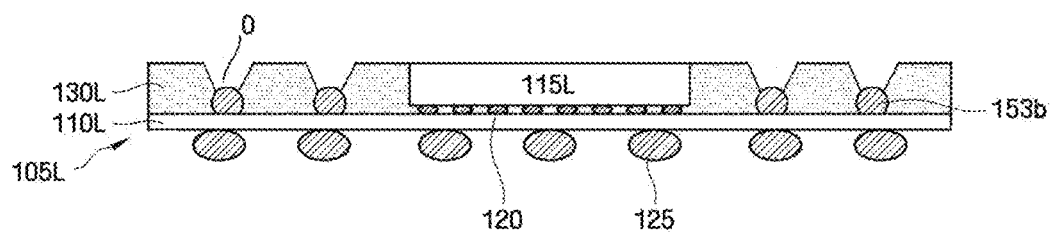

Referring to FIG. 7C, part of the lower molding compound 130L, that is, a potential region of an inter-package connecting portion 150a, is removed, thereby forming one or more openings O exposing the top surface of each of lower conductors 153b. The openings O may be, for example, via holes. A lower portion of each of the upper conductor 154b is inserted into each opening O in a stacking process to be described later (see FIG. 7E). In a case where the lower conductor 153b has a smaller horizontal width or area than the upper conductor 154b, each opening O has horizontal widths gradually increasing upwardly. The removing of the part of the lower molding compound 130L may be performed, for example, by laser drilling.

Next, solder balls 125 are formed on the bottom surface of the lower package substrate 110L. The solder balls 125 may be electrically connected to the chip bumps 120 and may be formed by soldering.

Figure 7D:
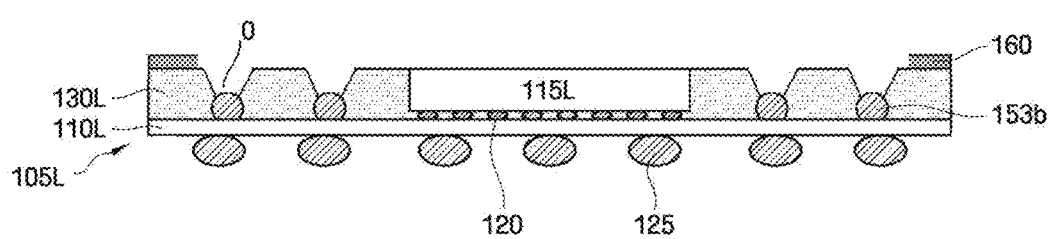

After performing the processes shown in FIGS. 6A and 7A to 7C, referring to FIG. 7D, an insulation layer 160 is formed on the top surface of the lower molding compound 130L so as to surround the openings O from the peripheral regions of the openings O. The forming of the insulation layer 160 may be performed by coating an under-fill material or attaching an insulating tape, but the present disclosure is not limited thereto. Although not shown, the insulation layer 160 may be formed on the bottom surface of the upper package substrate 110U so as to surround the upper conductors 154b from the peripheral regions of the upper conductors 154b, corresponding to the position of the insulation layer 160 shown in FIG. 7D.

Figure 7E:
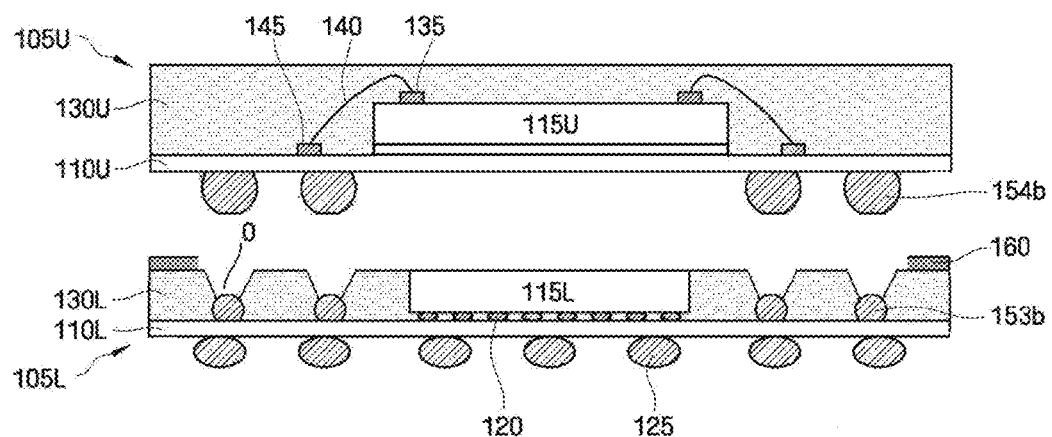

Referring to FIG. 7E, the upper semiconductor package 105U is stacked on the lower semiconductor package 105L having the insulation layer 160. More specifically, the upper semiconductor package 105U is disposed on the lower semiconductor package 105L having the insulation layer 160 such that each of the upper conductors 154b is inserted into the corresponding opening O, followed by heating and/or compressing, thereby electrically and physically combining and connecting the lower conductor 153a and the upper conductor 154b to each other. As a result, the lower conductors 153a and the upper conductors 154b electrically and physically combined and connected to each other integrally form an inter-package connecting portion (see 150b of FIG. 2B). In addition, as described above, the insulation layer 160 may have an adhesive property, so that a top surface of the lower molding compound 130L of the lower semiconductor package 105L and a bottom surface of the upper package substrate 110U of the upper semiconductor package 105U may be attached to the insulation layer 160.

Next, an electromagnetic shielding layer 170 is formed to surround lateral and top surfaces of a hexahedral stacked package that is a resultant produce of the process shown in FIG. 7E in the same manner as in FIG. 6I.

In the above-described method for manufacturing the stacked package structure according to this embodiment, the stacked package structures 100b-100e according to the modified examples of the first embodiment may be provided.

Figure 8:
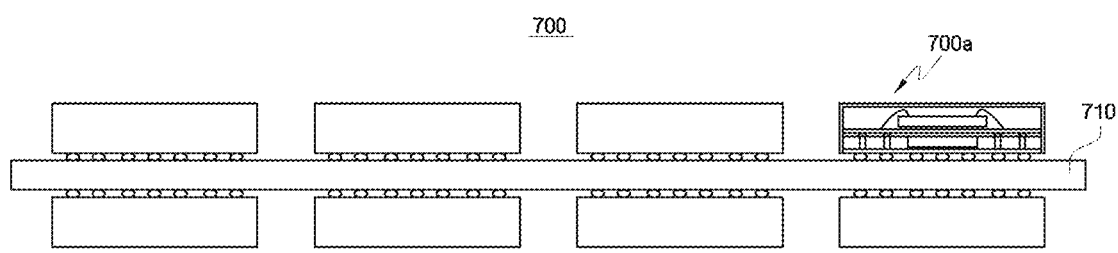
FIG. 8 is a conceptual diagram illustrating a semiconductor module including a stacked package structure according to certain exemplary embodiments.

FIG. 8 is a conceptual diagram illustrating a semiconductor module including a stacked package structure according to certain embodiments.

Referring to FIG. 8, the semiconductor module 700 includes a module board 710 and a plurality of semiconductor packages mounted on the module board 710. At least one of the plurality of semiconductor packages may include a stacked package structure 700a according to the embodiments discussed above.

The stacked package structure 700a according to certain embodiments is a package-on-package device that includes a stacked package surrounded by a shielding layer, thereby minimizing EMI between adjacent packages on the module board 710.

While the present disclosure has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A method of manufacturing a package-on-package device, comprising:
    forming a lower package including at least a first lower semiconductor chip stacked on a lower package substrate, and a lower molding layer surrounding lateral sides of the first lower semiconductor chip;
    forming a plurality of openings in the lower molding layer;
    forming a plurality of first conductors in the plurality of openings, respectively;
    forming an upper package including at least a first upper semiconductor chip stacked on an upper package substrate, and an upper molding layer surrounding lateral sides of the first upper semiconductor chip;
    stacking the upper package on the lower package to form a stacked package, such that a plurality of connecting conductors that include the plurality of first conductors, respectively, are disposed between the upper package substrate and the lower package substrate, the plurality of connecting conductors disposed in a region surrounding the lateral sides of the first lower semiconductor chip, and wherein each connecting conductor of the plurality of connecting conductors extends at least from a top surface of the lower package substrate to a bottom surface of the upper package substrate to physically and electrically connect the upper package to the lower package;
    wherein an insulation layer is disposed to laterally surround the region in which the plurality of connecting conductors are disposed, the insulation layer formed between the lower molding layer and the upper package substrate, and being exposed to an outside of the stacked package; and
    forming an electromagnetic shielding layer to surround lateral and top surfaces of the stacked package,
    wherein the plurality of connecting conductors include a set of outer-most connecting conductors and a set of inner connecting conductors, the two sets comprising all of the plurality of connecting conductors between the lower package substrate and the upper package substrate, and the insulation layer contacts at least some of the outer-most connecting conductors and does not contact any of the inner connecting conductors, and
    wherein the insulation layer forms a plug that prevents material used for the shielding layer from contacting the plurality of connecting conductors.

2. The method of claim 1, wherein:
forming the plurality of first conductors includes forming conductive balls, bumps, or through vias; and
each connecting conductor of the plurality of connecting conductors includes a conductive ball, bump, or through via and another conductive ball, bump, or through via.

3. The method of claim 1, wherein:
forming the electromagnetic shielding layer includes coating or plating the electromagnetic shielding layer on the stacked package to cover the lateral and top surfaces of the stacked package.

4. The method of claim 3, wherein:
the electromagnetic shielding layer contacts the insulation layer.

5. The method of claim 1, further comprising:
forming the plurality of first conductors in the plurality of openings by forming conductive through vias that extend from the top surface of the lower package substrate to a top surface of the lower package;
forming a plurality of second conductors includes forming a plurality of balls or bumps on the bottom surface of the upper package substrate; and
forming the connecting conductors by aligning the plurality of first conductors with the plurality of second conductors and performing a process that physically connects each first conductor with a respective second conductor.

6. The method of claim 1, wherein the electromagnetic shielding layer contacts the lower molding layer and the upper molding layer.

7. The method of claim 6, wherein the electromagnetic shielding layer contacts the exposed portion of the insulation layer.

8. The method of claim 1, wherein:
the electromagnetic shielding layer is a conductive layer.

9. The method of claim 8, wherein:
the electromagnetic shielding layer includes a soft magnetic material, a ferrite nanotube, or a metal layer.

10. A method of manufacturing a package-on-package device, comprising:
forming a lower package including at least a first lower semiconductor chip stacked on a lower package substrate, and a lower molding layer surrounding lateral sides of the first lower semiconductor chip and having a top surface and side surfaces;
forming an upper package including at least a first upper semiconductor chip stacked on an upper package substrate, and an upper molding layer surrounding lateral sides of the first upper semiconductor chip and having a top surface and side surfaces;
forming an insulation layer;
stacking the upper package on the lower package to form a stacked package, such that a plurality of connecting conductors extend between the upper package substrate and at least the lower molding layer, the plurality of connecting conductors disposed in a region outside of an area defined by the lateral sides of the first lower semiconductor chip when viewed from a plan view, and wherein each connecting conductor of the plurality of connecting conductors physically and electrically connects the upper package to the lower package,
wherein the insulation layer is formed to laterally surround the region in which the plurality of connecting conductors are disposed, the insulation layer formed between the top surface of the lower molding layer and a bottom surface of the upper package substrate, and being exposed to an outside of the stacked package; and
forming an electromagnetic shielding layer to surround lateral and top surfaces of the stacked package,
wherein the plurality of connecting conductors include a set of outer-most connecting conductors and a set of inner connecting conductors, the two sets comprising all of the plurality of connecting conductors between the lower molding layer and the upper package substrate, and the insulation layer contacts at least some of the outer-most connecting conductors and does not contact any of the inner connecting conductors, and
wherein the insulation layer forms a plug that prevents material used for the shielding layer from contacting the plurality of connecting conductors.

11. The method of claim 10, wherein:
the electromagnetic shielding layer contacts the side surfaces of the lower molding layer, the side surfaces of the upper molding layer, and the top surface of the upper molding layer.

12. The method of claim 11, wherein:
the electromagnetic shielding layer contacts the exposed portion of the insulation layer.

13. The method of claim 10, wherein:
the electromagnetic shielding layer is a conductive layer.

14. The method of claim 13, wherein:
the electromagnetic shielding layer includes a soft magnetic material, a ferrite nanotube, or a metal layer.

* * * * *